(12) United States Patent
Guan

(10) Patent No.: US 11,408,067 B2
(45) Date of Patent: Aug. 9, 2022

(54) LOADING JIG AND EVAPORATOR

(71) Applicants: BOE TECHNOLOGY GROUP CO., LTD., Beijing (CN); ORDOS YUANSHENG OPTOELECTRONICS CO., LTD., Inner Mongolia (CN)

(72) Inventor: Liwei Guan, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 161 days.

(21) Appl. No.: 16/215,829

(22) Filed: Dec. 11, 2018

(65) Prior Publication Data

US 2019/0233937 A1 Aug. 1, 2019

(30) Foreign Application Priority Data

Jan. 31, 2018 (CN) .......................... 201810096984.6

(51) Int. Cl.
*C23C 14/50* (2006.01)
*C23C 14/24* (2006.01)

(52) U.S. Cl.
CPC .............. *C23C 14/50* (2013.01); *C23C 14/24* (2013.01)

(58) Field of Classification Search
CPC ....... C23C 14/50; C23C 14/24; C23C 14/042; C23C 16/042; C23C 16/52;
(Continued)

(56) References Cited

U.S. PATENT DOCUMENTS 5,326,725 A * 7/1994 Sherstinsky .......... C23C 16/042
118/500
5,811,211 A * 9/1998 Tanaka ................ G03F 7/70066
382/145

(Continued)

FOREIGN PATENT DOCUMENTS

CN 203754795 U * 8/2014
CN 203754795 U 8/2014
(Continued)

OTHER PUBLICATIONS

CN203754795U Gou et al. English Machine translation retrieved from ESPACENET on May 31, 2020 (Year: 2020).*

(Continued)

*Primary Examiner* — Ram N Kackar
*Assistant Examiner* — Laureen Chan
(74) *Attorney, Agent, or Firm* — Calfee, Halter & Griswold LLP

(57) ABSTRACT

A loading jig and an evaporator are provided. The loading jig includes a body and at least one elastic membrane. The body has a plate-like structure and is sandwiched between the bearing platform and the plurality of clamping blocks. Said at least one elastic membrane is respectively disposed between at least one clamping block and a bottom of the body. The elastic membrane is externally connected to a signal converter. The pressure applied by the clamping block may be measured through the elastic membrane when the clamping block is pressed against the bottom of the body, and then the measured pressure signal is transmitted to the signal converter to be converted into a pressure value.

10 Claims, 3 Drawing Sheets

(58) Field of Classification Search
CPC .... C23C 14/22–32; C23C 16/448–453; H01L 51/56; H01L 21/67259; H01L 21/682; H01L 21/68721; H01L 21/68728; H01L 22/00; H01L 22/26; H01L 22/30; H01L 22/10; H01L 21/67005; H01L 21/68; G01L 5/226; G01L 5/008; G01L 5/0066; G01L 5/0085; G01L 25/00; G01L 7/022; G01L 1/26; G01L 1/144; G01N 3/04; G01N 2203/0254; H01J 37/32917–3299; H01J 37/32798; H01J 37/3288; H01J 37/32807; H05K 13/089

See application file for complete search history.

(56) References Cited

U.S. PATENT DOCUMENTS

| | | | | | |
|---|---|---|---|---|---|
| 5,961,722 | A | * | 10/1999 | Buhrer | H01L 21/68 118/500 |
| 2004/0031340 | A1 | * | 2/2004 | Renken | H01L 22/34 73/866.1 |
| 2006/0150910 | A1 | * | 7/2006 | Han | C23C 14/042 118/721 |
| 2006/0174720 | A1 | * | 8/2006 | Renken | H01L 22/34 73/866.1 |
| 2009/0258142 | A1 | * | 10/2009 | An | C23C 14/50 427/255.6 |
| 2013/0186335 | A1 | * | 7/2013 | Kawato | C23C 14/12 118/720 |
| 2019/0249290 | A1 | * | 8/2019 | Kishimoto | H05B 33/10 |

FOREIGN PATENT DOCUMENTS

| | | |
|---|---|---|
| CN | 105296951 A | 2/2016 |
| JP | 2005044923 A | 2/2005 |

OTHER PUBLICATIONS

First Office Action for Chinese Patent Application No. 201810096984.6 dated Jul. 23, 2019.

* cited by examiner

LOADING JIG AND EVAPORATOR

CROSS-REFERENCE TO RELATED APPLICATIONS

The present application is based on and claims priority to Chinese Patent Application No. 201810096984.6, filed on Jan. 31, 2018, the entire contents thereof are incorporated herein by reference.

TECHNICAL FIELD

The present disclosure relates to the field of manufacturing equipment for OLED device, and in particular, relates to a loading jig and an evaporator.

BACKGROUND

In the existing evaporation process of an organic light-emitting diode (OLED) device, a low temperature poly-silicon (LTPS) backplane is processed in OLED process through an array process (for example, including coating, exposure, etching, etc.), a cutting process and the like. The OLED process is to clamp the glass in the clamping assembly (Aligner) of the evaporator. The clamping assembly mainly includes a magnetic plate, a mask loading platform, and the glass is loaded on the glass platform by a clamp having a plurality of clamping blocks. The glass and the mask are aligned by coordinating actions of CCD and various components of the clamping assembly, and then are evaporated. The evaporator includes a plurality of cavities, each of which substantially has the same structure, wherein the clamping assembly consists of a plurality of small precise components with high frequency of actions and prone to offset. In particular, abnormal position, gap or clamping degree of various clamping blocks of the clamp may cause misalignment or fragment of the glass, which need to be regularly checked and adjusted. At present, there is no convenient jig for checking whether clamping blocks are currently aligned. Moreover, it takes more time and cost if cavities of the evaporator are checked.

In the existing evaporation process, management of clamping blocks in the glass loading device mainly includes measurement of parameters such as a first distance between clamping blocks, a second distance between the clamping block and the bearing platform and self-position of the clamping block. Among them, the first distance is usually measured by a traditional steel ruler. Due to deformation of the ruler itself and other components around the clamping block, the measurement accuracy is poor and has certain difficulty. The second distance is usually measured by a traditional feeler gauge. Due to different strengths sensed by a personnel, the measurement error is extremely large and millimeter-order errors may often occur. Furthermore, a slight change in position of the clamping blocks cannot be found and measured as there is no reference basis for positions of respective clamping blocks themselves.

SUMMARY

According to an aspect of the present disclosure, an embodiment of the present disclosure provides a loading jig used in a clamping assembly of an evaporator. The clamping assembly includes a bearing platform and a clamp, wherein the clamp includes a plurality of clamping blocks clamped at a periphery of the bearing platform. The loading jig includes a body and at least one elastic membrane. The body has a plate-like structure and is sandwiched between the bearing platform and the plurality of clamping blocks. Said at least one elastic membrane is respectively disposed between at least one clamping block and a bottom of the body. The elastic membrane is externally connected to a signal converter. A pressure value applied by the clamping block may be measured and output through the elastic membrane when the clamping block is pressed against the bottom of the body.

According to an embodiment of the present disclosure, a plurality of slots are provided on the bottom of the body, and the plurality of elastic membranes are respectively disposed at bottoms of the plurality of slots; wherein, when the loading jig is clamped by the plurality of clamping blocks, the plurality of clamping blocks are respectively clipped into the plurality of slots, and are pressed against the elastic membrane.

According to an embodiment of the present disclosure, the shape of the slot matches that of the clamping block.

According to an embodiment of the present disclosure, a bottom surface of the body is marked with a scale pattern, scales on the scale pattern respectively correspond to positions of the body contacting with respective clamping blocks.

According to an embodiment of the present disclosure, the bottom surface of the body is marked with at least two groups of scale patterns, one group of the scale patterns are distributed in a longitudinal direction of the body, and the other group of the scale patterns are distributed in a width direction of the body.

According to an embodiment of the present disclosure, a plurality of first through holes are provided on the bearing platform; wherein a plurality of second through holes are provided on the body, the plurality of second through holes respectively correspond to the plurality of first through holes.

According to an embodiment of the present disclosure, the body is made of PVC material.

According to an embodiment of the present disclosure, the elastic membrane is a sheet-like pressure sensor.

According to an embodiment of the present disclosure, the loading jig further includes a display screen connected with the signal converter, so as to display a pressure value corresponding to each of clamping blocks.

According to another aspect of the present disclosure, an embodiment of the present disclosure further provides an evaporator, including a housing and a clamping assembly disposed inside the housing. The clamping assembly includes a magnetic plate, a bearing platform for carrying a workpiece and a clamp. The clamp includes a plurality of clamping blocks clamped at a periphery of the bearing platform. The evaporator further includes the loading jig of the above embodiment. The loading jig includes a body and at least one elastic membrane. The body has a plate-like structure and is sandwiched between the bearing platform and the plurality of clamping blocks. At least one elastic membrane is respectively disposed between at least one clamping block and a bottom of the body. The elastic membrane is externally connected to a signal converter. As the loading jig is clamped at a bottom of the bearing platform by the plurality of clamping blocks, a pressure value applied by clamping blocks may be measured and output through the elastic membrane when the plurality of clamping blocks are respectively pressed against the bottom of the body.

BRIEF DESCRIPTION OF THE DRAWINGS

The various objects, features and advantages of the present disclosure will become more apparent from the detailed description of the embodiments of the present disclosure in combination with accompanying drawings. The drawings are only illustrative of the present disclosure and are not necessarily to scale. In the drawings, the same reference numbers always refer to same or similar components. In the drawings.

DETAILED DESCRIPTION

Figure 1:
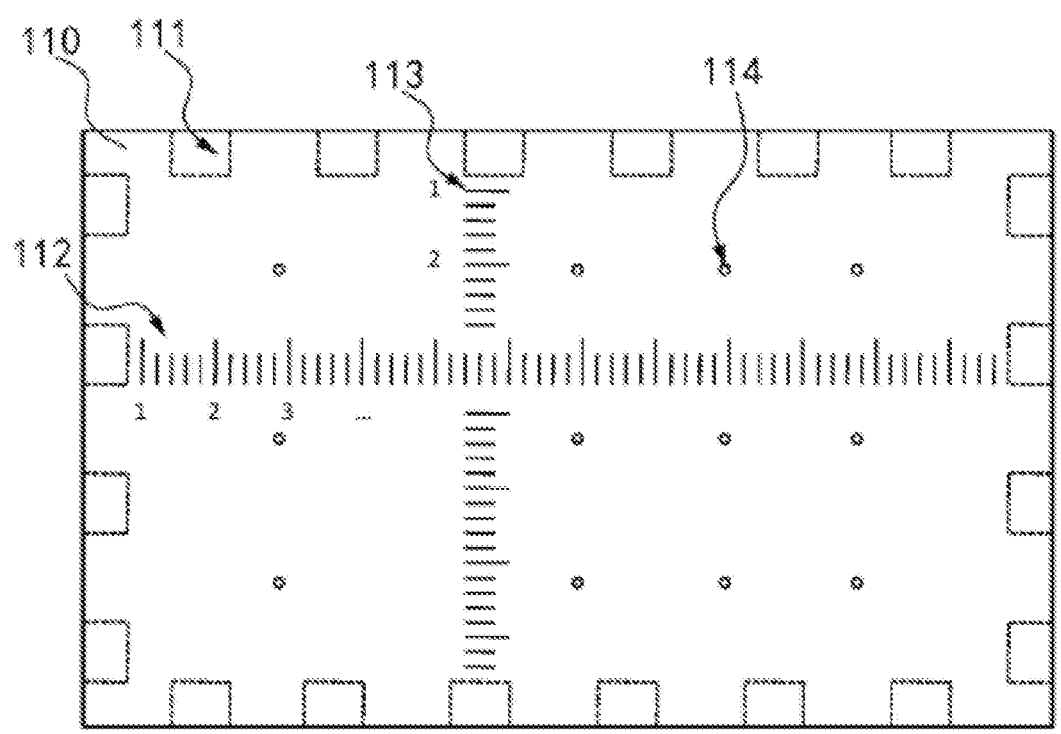
FIG. 1 is a top view of a loading jig according to an exemplary embodiment.

Exemplary embodiments embodying features and advantages of the present disclosure will be described in detail in the following description. It should be understood that there may be various modifications on various embodiments of the present disclosure without departing from the scope of the present disclosure, the description and drawings herein are to be substantially regarded as illustrative rather than restrictive of the present disclosure.

In the following description of various exemplary embodiments of the present invention, the drawings constitute part of the present disclosure with reference to the drawings, and various exemplary structures, systems and steps in which various aspects of the present disclosure may be implemented are shown by way of example. It should be understood that other specific solutions of components, structures, exemplary devices, systems and steps can be used, and structural and functional modifications can be made without departing from the scope of the present disclosure. Moreover, although terms "between", "bottom", "peripheral" and the like may be used in the specification to describe various exemplary features and elements of the present disclosure, these terms are used herein for convenience only, e.g. the exemplary direction shown in the drawings. Nothing in this specification should be construed to require a particular three dimensional orientation of the structure to fall within the scope of the disclosure.

Embodiment of Loading Jig

With reference to FIG. 1, a top view of the loading jig proposed by the present disclosure representatively shown. In the exemplary embodiment, the loading jig proposed by the present disclosure is used in a reinforcing assembly of an evaporator, and in particular, disposed in the clamping assembly of the evaporator instead of a glass substrate 700 as an example, wherein so called "loading" mainly refers to be clamped in the clamping assembly. It should be readily understood by those skilled in the art that various modifications, additions, substitutions, deletions, or other changes can be made to the specific embodiments described below in order to apply the related designs of the present disclosure to other process equipment, which are still within the scope of principles of the loading jig of the present disclosure.

Figure 2:
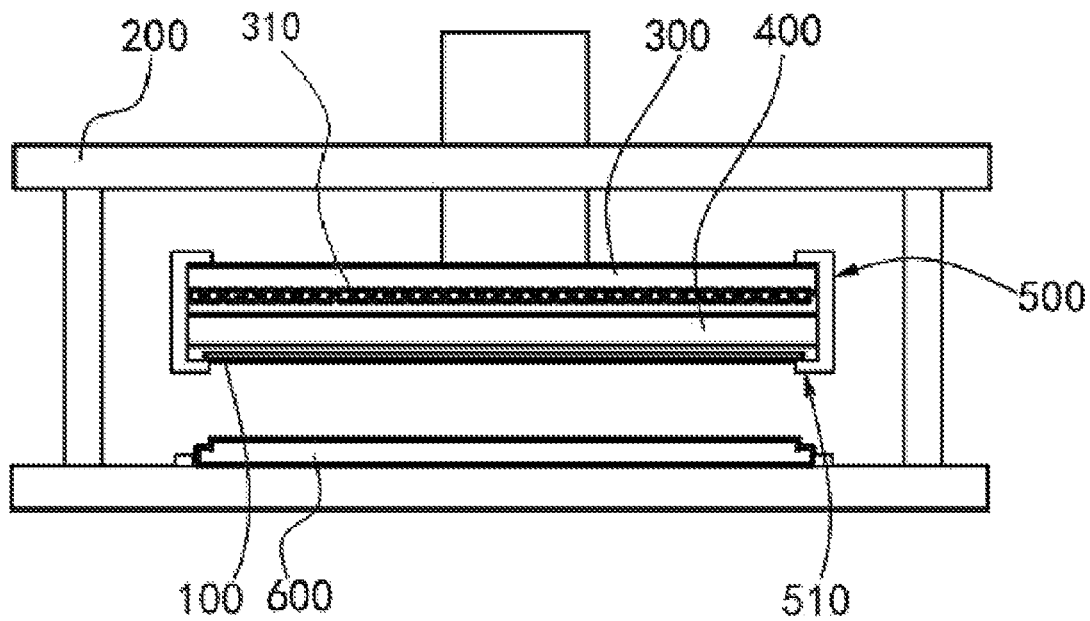
FIG. 2 is a schematic structural view of an evaporator according to an exemplary embodiment.
Figure 3:
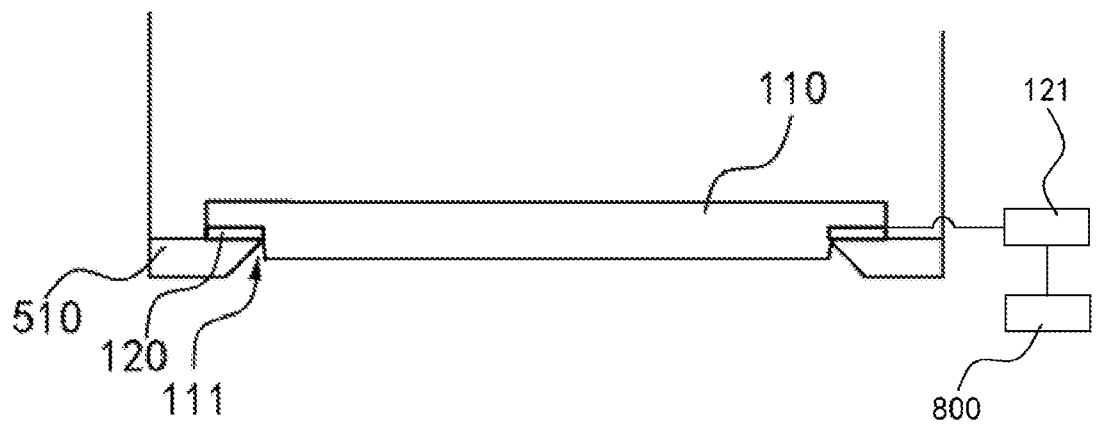
FIG. 3 is a partial schematic view of the evaporator shown in FIG. 2.
Figure 4:
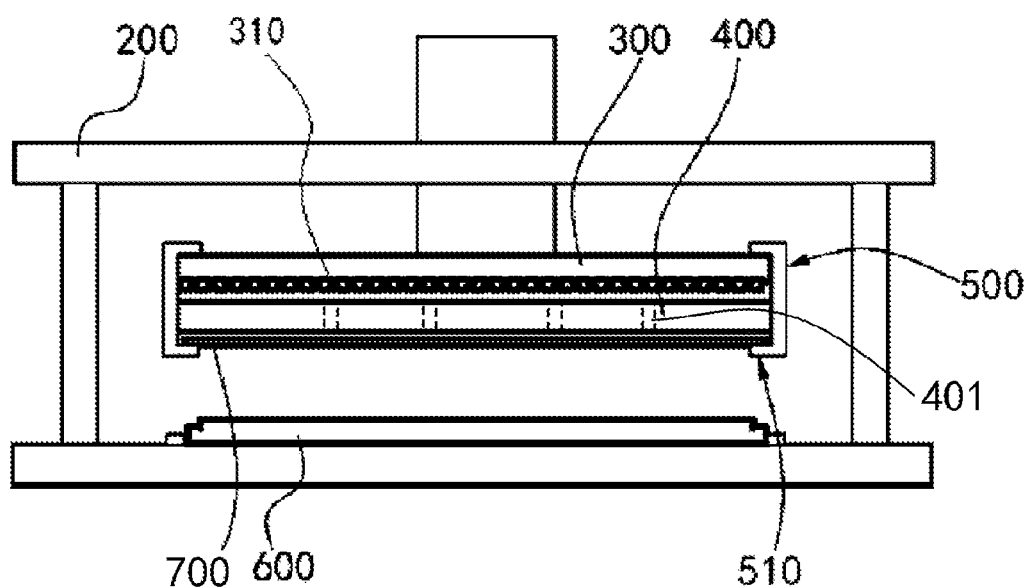
FIG. 4 is a schematic structural view of an evaporator according to an exemplary embodiment.

As shown in FIG. 1, the loading jig 100 proposed by the present disclosure mainly includes a body 110 and a plurality of elastic membranes 120. Also referring to FIG. 2 and FIG. 3, FIG. 2 representatively shows a schematic structural view of an evaporator having the loading jig 100, and FIG. 3 representatively shows a partial schematic view of the evaporator shown in FIG. 2, which specifically shows cooperative relationship between the loading jig 100 and the clamping block 510. The structure, connection mode and functional relationship of various main components of the loading jig 100 proposed by the present disclosure will be described in detail below with reference to the accompanying drawings.

The loading jig 100 proposed by the present disclosure is disposed in the clamping assembly of the evaporator. Specifically, the clamping assembly mainly includes a magnetic plate 300, a bearing platform 400 and a clamp 500 clamped at a top portion of the magnetic plate 300 and a bottom of the bearing platform 400, in which the clamp 500 having a plurality of clamping blocks 510 clamped at the bottom of the bearing platform 400. When the above evaporator is used to evaporate a glass substrate 700, the glass substrate 700 is clamped between the bottom of the bearing platform 400 and the plurality of clamping blocks 510. At this time, the bearing platform 400 is a platform carrying the glass substrate 700 to be processed. The magnetic plate 300 is used to apply a magnetic attraction force to a mask 600 under the clamping assembly through a plurality of magnetic strips 310 at the bottom. Based on this, the loading jig 100 proposed by the present disclosure is used to replace glass substrate 700 and clamped between a bottom of the bearing platform 400 and the plurality of clamping blocks 510, and then measurement and assisted correction of each clamping block 510 are achieved by special design of the loading jig 100 itself. During measurement and correction of each clamping block 510 by using the loading jig 100, a mask 600 need not be adsorbed by the magnetic plate 300, and thus the mask 600 shown in FIG. 1 is located below the clamping assembly without being adsorbed at the bottom of the loading jig 100. In addition, during normal evaporation, the mask 600 is absorbed at the bottom of the glass substrate 700 by the magnetic plate 300, which may specifically refer to related design of the existing evaporator and will not be described in detail.

As shown in FIG. 1 and FIG. 3, in an embodiment, the body 110 of the loading jig 100 has a substantially plate-like structure, and may be made of PVC material or other hard material. The body 110 is sandwiched between the bearing platform 400 and the plurality of clamping blocks 510. Thus, when a workpiece is clamped by the clamping assembly, the plurality of clamping blocks 510 under the clamp 500 is actually sandwiched at a periphery of the body 110. Specifically, it is sandwiched at the bottom of the body 110 and clamped at the bottom of the bearing platform 400 through the body 110, i.e. an upper surface of the body 110 is attached to a lower surface of the bearing platform 400.

As shown in FIG. 1 and FIG. 3, in an embodiment, at least one elastic membrane is respectively disposed between at least one clamping block 510 and the body 110. Specifically, a plurality of elastic membranes 120 are respectively disposed at the bottom of body 110, and respectively correspond to positions of the plurality of clamping blocks 510. The plurality of elastic membranes 120 are externally connected to a signal converter 121 for example by leads. Accordingly, when the workpiece is clamped by the clamping assembly, the plurality of clamping blocks 510 respectively press on the plurality of elastic membranes 120. The elastic membrane 120 is capable of measuring the pressure applied by the corresponding clamping block 510, and then transmitting the measured pressure signal to a signal converter 121 and converting into a pressure value. According to the above design, the operator may adjust the clamping block 510 with abnormal pressure value by comparing pressure values of clamping blocks 510 measured with respect to the respective elastic membranes 120.

In other embodiments, the number of elastic membranes is also not limited to the description of this embodiment. For example, when the number of clamping blocks is plural, there may be at least one elastic membrane which corresponds to at least one clamping block, i.e. the elastic membrane is provided on at least one position of the bottom of the body corresponding to the clamping block, so that the pressure applied to the body by at least one of the plurality of clamping blocks may be measured by using at least one elastic membrane.

In an embodiment of the present disclosure, the elastic membrane 120 may be selected as a sheet-like pressure sensor. In other embodiments, the elastic membrane 120 may also be selected as other elastic pressure element and further be a type with the thinnest thickness.

As shown in FIG. 1 and FIG. 3, in the embodiment, a plurality of slots 111 is provided at the bottom of the body 110. The plurality of elastic membranes 120 are respectively disposed at the bottom of the plurality of slots 111. Accordingly, when the plurality of clamping blocks 510 are clamped at the bottom of the body 100 of the loading jig 100, the plurality of clamping blocks 510 are respectively clipped into the plurality of slots 111 and are pressed against the elastic membrane 120 at the bottom. Based on the above design, a distance between positions where the body 110 of the loading jig 100 is clamped by clamping blocks 510 and adjacent clamping blocks 510 may be determined by using a pre-design for a distance between positions of each slot 111 itself and the adjacent slot 111.

In an embodiment of the present disclosure, the shape of the slot 111 matches that of the clamping block 510, i.e. there is a shape matching between the slot 111 and the clamping block 510. So called "shape matching" in the embodiment means that the shape of the slot 111 is the same as the shape of a portion of the clamping block 510 sandwiched on the body 110. In other embodiment, the "shape matching" may also include forms in which their widths are the same and in which the width of slot 111 is slightly larger than the width of the clamping block 510. Accordingly, when the clamping block 510 is clamped at the bottom of the body 110, the position of the clamping block 510 is shown as abnormal when any one of clamping blocks 510 does not enter the respective slot 111, so as to facilitate targeted adjustment performed by the operator, and simultaneously, further avoid shaking problem caused by inconsistent dimensions when the clamping block 510 is clipped into the slot 111.

As shown in FIG. 1 to FIG. 3, in an embodiment of the present disclosure, the slot 111 is also disposed at the position where the bottom of the body 110 is adjacent to the periphery thereof and a slot wall at a side of the slot 111 is opened at the side of the body 110, based on the design in which the clamping block 510 is clamped at the periphery of the bottom of the body 110. Specifically, as shown in FIG. 3, the clamping block 510 is partially clamped to the bottom of the body 110, and the remaining portion of the clamping block 510 passes through the slot wall of the slot 111 opening to the side of the body 110. In other embodiments, when the clamping block is fully clamped to the bottom of the body, the slot may also have a complete slot wall structure without opening to the side of the body.

As shown in FIG. 1, in an embodiment of the present disclosure, the bottom of the body 110 is marked with a scale pattern. Accordingly, the operator may obtain the specific positions where each clamping block 510 is clamped at the bottom of the body 110 referring to the scale at the mark on the scale pattern, so as to facilitate the operator to adjust positions of clamping blocks 510 themselves, i.e. the gap between adjacent clamping blocks 510.

In an embodiment of the present disclosure, scales on the scale pattern respectively correspond to positions of the body 110 contacting with the respective clamping block 510, so that adjustment of clamping blocks 510 by the operator is more convenient and intuitive.

As shown in FIG. 1, in an embodiment of the present disclosure, the bottom of the body 110 is marked with at least two groups of scale patterns, i.e. first scale patterns 112 and second scale patterns 113. The first scale patterns 112 are distributed in a longitudinal direction of the body 110 for the operator to compare positions of clamping blocks 510 clamped on both sides of the body 110 in the longitudinal direction. The second scale patterns 113 are distributed in the width direction of the body 110 for the operator to compare positions of clamping blocks 510 clamped on both side of the body 110 in the width direction.

As shown in FIG. 1, in an embodiment of the present disclosure, a plurality of second through holes 114 are provided on the body 110 of the loading jig 100 based on the existing design in which a plurality of first through holes 401 is provided on the bearing platform 400, and the plurality of second through holes 114 respectively correspond to the plurality of first through holes 401. Accordingly, when the workpiece is clamped by the clamping assembly, i.e. when the body 110 is adhered to the bottom of the bearing platform 400, the plurality of second through holes 114 and the plurality of first through holes 401 should be in one-to-one correspondence ideally, thereby facilitating the operator to further adjust and align the clamping assembly accordingly. Moreover, with the above design, gas between the body 110 and the bearing platform 400 may be discharged through the second through hole 114 (the first through hole 401 has been covered by the glass carried on the bearing platform 400) during a step in which the clamping assembly performs a clamping action, i.e. during a process of gradually pressing the body 110 and the bearing platform 400, so as to facilitate discharge of residual gas and further optimize position effect of clamping.

It should be noted herein that the loading jig shown in the drawings and described in this specification is just a few examples of many types of loading jigs that can use the principles of the present disclosure. It should be clearly understood that principles of the present disclosure are not limited to any detail of the loading jig or any component of the loading jig shown in the drawings or described in this specification.

In an embodiment of the present disclosure, for signal converters 121 cooperating with respective elastic membranes 120, the plurality of elastic membranes 120 may be respectively connected with signal converters 121 by using external leads, and may further be connected with a display screen 800. Accordingly, when the body 110 is clamped by the clamping block 510, the elastic membrane 120 is subjected by pressure and the pressure is transmitted to the signal converter 121 through external leads to be converted into a pressure value, and then the operator may directly observe that the corresponding pressure value of each clamping block 510 through the display screen 800, so that the degree of tightness is intuitively known to adjust the corresponding clamping block 510 with a large difference in pressure value in time.

Embodiment of Evaporator

With reference to FIG. 2, a schematic structural view of the evaporator proposed by the present disclosure is representatively shown. In the exemplary embodiment, the evaporator proposed by the present disclosure is described as an example of an evaporation device that evaporates the glass in the process of an OLED device. It will be readily understood by those skilled in the art that various modifications, additions, substitutions, deletions, or other changes can be made to the specific embodiments described below, which should be within the scope of principles of the evaporator proposed by the present disclosure, in order to apply related designs of the present disclosure to other process equipment.

As shown in FIG. 2 and FIG. 3, in the embodiment, the evaporator proposed by the present disclosure mainly includes a housing 200, a clamping assembly disposed inside the housing 200 and a mask 600 located under the clamping assembly. Specifically, the clamping assembly mainly includes a magnetic plate 300, a bearing platform 400, a clamp 500 and the loading jig 100 exemplarily described in the above embodiments. Structures of the magnetic plate 300, the bearing platform 400 and the clamp 500 may refer to related designs of the existing evaporator, which will not be described in detail. Accordingly, when the body 110 of the loading jig 100 is clamped at the bottom of the bearing platform 400 by clamping blocks 510 of the plurality of clamps 500, the plurality of clamping blocks 510 respectively press against the plurality of elastic membranes 120, the elastic membrane 120 transmits the measured pressure signal to the signal converter 121 to convert into a pressure value, so that the operator can correct the corresponding clamp block 510 according to the pressure value corresponding to each clamp 510. The evaporator has a control system which is capable of controlling the pressure applied by the clamping block 510 and then the clamping block 510 is corrected by the operator via the control system. The pressure values applied by the corrected individual blocks 510 are simultaneously stored in the control system. When the glass substrate 700 is processed to be evaporated by using the evaporator, the loading jig is removed, and the glass substrate 700 to be processed is placed at the position where the jig is loaded during the measurement of correction. The operator controls the control system to clamp the glass substrate 700 by the bearing platform and the corrected plurality of clamping blocks, so that pressure values applied to the glass substrate 700 by clamping blocks 510 are pressure values applied to the loading jig by the respective pressure blocks 510 after correction, thereby ensuring clamping force of clamping blocks with respect to the glass substrate 700 to be balanced and ensuring clamping position to be accurate.

It should be noted herein that the evaporator illustrated in the drawings and described in this specification is just a few examples of many types of evaporators that can use principles of the present disclosure. It should be clearly understood that the principles of the present disclosure are not limited to any detail of the evaporator or any component of the evaporator illustrated in the drawings or described in this specification.

In summary, the loading jig and the evaporator proposed by the present disclosure can accurately measure the pressure applied by clamping blocks of the clamp on the loading jig when the clamping assembly clamps the workpiece by using the plurality of elastic membranes, i.e. measure the clamping force of the clamp at each position, so that parameters including the distance between clamping blocks, the distance between the clamping block and the bearing platform, and the position of the clamping block can be obtained by pressure, and so that the operator can accurately and conveniently measure the clamping state of the clamping assembly, effectively reducing maintenance time of the equipment, achieving comprehensive inspection and maintenance of the equipment in a short time, improving equipment stability, preventing downtime, and improving utilization rate of the equipment.

Exemplary embodiments of the loading jig and the evaporator proposed by the present disclosure are described and/or illustrated in detail above. However, embodiments of the present disclosure are not limited to the specific embodiments described herein, but rather, components and/or steps of each embodiment can be used independently and separately from other components and/or steps described herein. Each component and/or each step of an embodiment may also be used in combination with other components and/or steps of other embodiments. When introducing elements/components/etc. described and/or illustrated herein, the terms "a", "an", "the" and "said" are used to indicate the presence of one or more elements/components. The terms "comprise", "include" and "have" are used to mean an inclusive meaning and are meant to mean additional elements/components, etc. in addition to the listed elements/components/etc. The terms "first", "second" and the like in the claims and the description are used merely as a mark, not a numerical limitation of the object.

While the loading jig and the evaporator proposed by the present disclosure have been described in terms of various specific embodiments, those skilled in the art will recognize that the embodiments of the present disclosure may be modified within the spirit and scope of the claims.

What is claimed is:

1. A loading jig used in a clamping assembly of an evaporator, the clamping assembly comprising a bearing platform and a clamp, the clamp comprising a plurality of clamping blocks clamped at a periphery of the bearing platform, the evaporator further comprising a glass substrate, wherein the loading jig comprises:
   a body having a plate-like structure and removably sandwiched between the bearing platform and the plurality of clamping blocks in a position where the glass substrate to be processed is placed during an evaporation process; and
   a plurality of elastic membranes, each elastic membrane respectively disposed between each clamping block and a bottom of the body, the plurality of elastic membranes being externally connected to a signal converter;
   wherein a pressure value applied by the clamping block is measured and outputs through the plurality of elastic membranes when the clamping block is pressed against the bottom of the body, such that the clamping block is to be corrected by an operator according to the pressure value from the loading jig;
   wherein a plurality of slots are provided on the bottom of the body, and the plurality of elastic membranes are respectively disposed at corresponding bottoms of the plurality of slots, wherein, when the loading jig is clamped by the plurality of clamping blocks, the plurality of clamping blocks are respectively clipped into the plurality of slots, and are pressed against the corresponding elastic membrane, such that a distance between positions where the body is clamped by two adjacent ones of the clamping blocks is determined by using a pre-design for a distance between positions of two adjacent ones of the slots;
   wherein a shape of each slot includes an opening of a slot wall that opens at the side of the body and matches a shape of each clamping block, such that, a portion of each clamping block is clamped to the bottom of the body and the remaining portion of each clamping block passes through the opening of the slot wall, and when any one of the clamping blocks does not enter a corresponding one of the slots, a position of the said one clamping block is shown as abnormal and needs adjustment, and wherein a bottom surface of the body is marked with at least two groups of scale patterns, one group of the scale patterns are distributed in a longitudinal direction of the body, the other group of the scale patterns are distributed in a width direction of the body, and scales on the scale patterns respectively correspond to positions of the body contacting with respective clamping blocks, such that specific positions where the respective clamping blocks are clamped at the bottom of the body are to be obtained by the operator by referring to the scales on the scale pattern, such that positions of respective clamping blocks are to be adjusted by the operator.

2. The loading jig according to claim 1, wherein a plurality of first through holes are provided on the bearing platform, and a plurality of second through holes are provided on the body, the plurality of second through holes respectively correspond to the plurality of first through holes.

3. The loading jig according to claim 1, wherein the body is made of PVC material.

4. The loading jig according to claim 1, wherein the elastic membrane is a sheet-like pressure sensor.

5. The loading jig according to claim 1, further comprising a display screen connected with the signal converter, and displaying a pressure value corresponding to each of the clamping blocks.

6. An evaporator comprising a housing, a clamping assembly disposed inside the housing and a glass substrate, the clamping assembly comprising a magnetic plate, a bearing platform for carrying a workpiece and a clamp, the clamp comprising a plurality of clamping blocks clamped at a periphery of the bearing platform, wherein the evaporator further comprises:

a loading jig, the loading jig comprising:

a body having a plate-like structure and removably sandwiched between the bearing platform and the plurality of clamping blocks in a position where the glass substrate to be processed is placed during an evaporation process; and a plurality of elastic membranes, each elastic membrane respectively disposed between each clamping block and a bottom of the body, the plurality of elastic membranes being externally connected to a signal converter;

wherein as the loading jig is clamped at a bottom of the bearing platform by the plurality of clamping blocks, pressure values applied by clamping blocks are measured and outputs through the plurality of elastic membranes when the plurality of clamping blocks are respectively pressed against the bottom of the body, such that the clamping blocks are to be corrected by an operator according to the pressure values from the loading jig;

wherein a plurality of slots are provided on the bottom of the body, and the plurality of elastic membranes are respectively disposed at corresponding bottoms of the plurality of slots, wherein, when the loading jig is clamped by the plurality of clamping blocks, the plurality of clamping blocks are respectively clipped into the plurality of slots, and are pressed against the corresponding elastic membrane, such that a distance between positions where the body is clamped by two adjacent ones of the clamping blocks is determined by using a pre-design for a distance between positions of two adjacent ones of the slots;

wherein a shape of each slot includes an opening of a slot wall that opens at the side of the body and matches a shape of each clamping block, such that, a portion of each clamping block is clamped to the bottom of the body and the remaining portion of each clamping block passes through the opening of the slot wall, and when any one of the clamping blocks does not enter a corresponding one of the slots, a position of the said one clamping block is shown as abnormal and needs adjustment, and wherein a bottom surface of the body is marked with at least two groups of scale patterns, one group of the scale patterns are distributed in a longitudinal direction of the body, the other group of the scale patterns are distributed in a width direction of the body, and scales on the scale patterns respectively correspond to positions of the body contacting with respective clamping blocks, such that specific positions where the respective clamping blocks are clamped at the bottom of the body are to be obtained by the operator by referring to the scales on the scale pattern, such that positions of respective clamping blocks are to be adjusted by the operator.

7. The evaporator according to claim 6, wherein a plurality of first through holes are provided on the bearing platform, and a plurality of second through holes are provided on the body, the plurality of second through holes respectively correspond to the plurality of first through holes.

8. The evaporator according to claim 6, wherein the body is made of PVC material.

9. The evaporator according to claim 6, wherein the elastic membrane is a sheet-like pressure sensor.

10. The evaporator according to claim 6, wherein the loading jig further comprises a display screen connected with the signal converter, and displaying a pressure value corresponding to each of the clamping blocks.

* * * * *